United States Patent
Zank et al.

(10) Patent No.: US 7,154,275 B2
(45) Date of Patent: Dec. 26, 2006

(54) METHOD AND APPARATUS FOR DETECTING INDIVIDUALS USING ELECTRICAL FIELD SENSORS

(75) Inventors: Paul A. Zank, Brookline, NH (US); Eldon M. Sutphin, Merrimack, NH (US); David W. Buchanan, Brookline, NH (US); George P. Succi, Merrimack, NH (US)

(73) Assignee: Bae Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 11/148,499

(22) Filed: Jun. 9, 2005

(65) Prior Publication Data
US 2006/0261818 A1 Nov. 23, 2006

Related U.S. Application Data

(63) Continuation-in-part of application No. 10/917,793, filed on Aug. 12, 2004, which is a continuation-in-part of application No. PCT/US03/04092, filed on Feb. 13, 2003, and a continuation-in-part of application No. 10/315,561, filed on Dec. 10, 2002, now Pat. No. 6,922,059.

(60) Provisional application No. 60/640,465, filed on Dec. 31, 2004.

(51) Int. Cl.
*G01R 29/12* (2006.01)
*G08B 13/26* (2006.01)

(52) U.S. Cl. ........................ 324/457; 340/561
(58) Field of Classification Search ............... 324/457, 324/671, 686; 340/561
See application file for complete search history.

(56) References Cited

U.S. PATENT DOCUMENTS

| | | | | |
|---|---|---|---|---|
| 2,454,630 A * | 11/1948 | Buckthal | ...... | 324/72 |
| 3,573,817 A * | 4/1971 | Akers | ...... | 340/522 |
| 3,785,557 A * | 1/1974 | Womack | ...... | 239/14.1 |
| 3,928,801 A * | 12/1975 | Hill | ...... | 324/160 |
| 4,224,540 A * | 9/1980 | Okubo | ...... | 307/400 |
| 4,553,135 A * | 11/1985 | Grynberg et al. | ...... | 340/564 |
| 4,743,886 A * | 5/1988 | Steiner et al. | ...... | 340/514 |
| 4,931,740 A * | 6/1990 | Hassanzadeh et al. | ...... | 324/457 |
| 4,951,045 A * | 8/1990 | Knapp et al. | ...... | 340/944 |
| 5,247,281 A * | 9/1993 | Facon et al. | ...... | 340/562 |
| 5,300,889 A * | 4/1994 | Bakhoum | ...... | 324/457 |
| 5,371,509 A * | 12/1994 | Wallace et al. | ...... | 343/741 |
| 5,730,165 A * | 3/1998 | Philipp | ...... | 137/1 |
| 5,986,549 A * | 11/1999 | Teodorescu | ...... | 340/561 |
| 6,031,378 A * | 2/2000 | Rosin | ...... | 324/452 |
| 6,456,198 B1 * | 9/2002 | Kato et al. | ...... | 340/564 |
| 2003/0209893 A1 * | 11/2003 | Breed et al. | ...... | 280/735 |

* cited by examiner

*Primary Examiner*—Anjan Deb
(74) *Attorney, Agent, or Firm*—Robert K. Tendler; Daniel J. Long

(57) ABSTRACT

A robust, easily deployable, covert, passive intrusion detection system uses one or more E-field sensors to detect the presence of a moving individual and to provide an indication of the presence of the individual adjacent the sensor based on E-field distortion produced by the individual. Single-ended and differential E-field sensors with noise canceling and a guarding circuit provide sufficient sensitivity, with filtering from 0.5 Hz to 8.0 Hz selecting only human intruders. Either visible or invisible flashing light sources at the sensor indicate the presence of a moving individual at the sensor, thus to provide intruder location without the necessity of providing a geolocation system.

20 Claims, 11 Drawing Sheets

METHOD AND APPARATUS FOR DETECTING INDIVIDUALS USING ELECTRICAL FIELD SENSORS

CROSS REFERENCE TO RELATED APPLICATIONS

This Application claims rights under 35 USC § 119(e) from U.S. Application Ser. No. 60/640,465 filed Dec. 31, 2004. This application is also a continuation-in-part from U.S. application Ser. No. 10/917,793 filed Aug. 12, 2004 entitled "Method to Detect and Determine Bearing to a Rocket Launch or Muzzle Blast" by Paul A. Zank et al., which is a continuation-in-part of US Application Serial No. PCT/US03/04092 filed Feb. 13, 2003 of the same title; and this application is also a continuation-in-part from U.S. application Ser. No. 10/315,561 filed Dec. 10, 2002 by Paul A. Zank et al., entitled "Electric Field Sensor," now U.S. Pat. No. 6,922,059, the contents all of which are incorporated herein by reference.

FIELD OF THE INVENTION

This invention relates to detection of the presence of individuals and more particularly to E-field sensors for detecting the presence of intruders.

BACKGROUND OF THE INVENTION

It has been a common problem, especially in battlefield scenarios, to be able to detect troop movement so that one may know of the presence of hostile forces, whether they are assembled in a group or individually. Intrusion detection has been attempted by radar-type devices, acoustic devices, trip wires, video sensors, seismic sensors and thermal sensors, with these sensors designed either to detect moving vehicles, ordnances or the like, but not directed specifically to the detection of an individual per se.

The presence of individuals has been detected by trip wires that have to be positioned ahead of time, such that when an individual physically contacts the trip wire, an indication is provided of the presence of the individual. However, this type of mechanical sensor has an extremely high false alarm rate, for instance, when tree limbs or the like fall on them, animals trip over them or are activated by high winds, lightning and other anomalies.

Infrared has been used in the past to detect the presence of individuals but the use of infrared as a medium is problematic due to changes in scene illumination, such as changes that can occur when a cloud goes overhead.

Video surveillance is a known technique but requires a tremendous amount of bandwidth and a human being to review the reconstruction of the video scene to ascertain when a person is intruding. Pattern recognition has been employed when using video surveillance. However, pattern recognition requires a large amount of computer overhead, is not necessarily portable and oftentimes fails with changes in the scene, for instance, due to fluttering leaves, moving branches and the like.

Radar has also been used in attempt to detect intrusion. However, radar only reflects off of objects having a high radar cross-section and is not often used because the radar systems are active systems that reveal their existence and location. Moreover, when the radar is on, individuals know that they have been illuminated, and are thus able to avoid areas swept by radar.

What is therefore needed is a completely passive system that is extremely low power and is portable, such that the system can be deployed in a stealth fashion so that enemy troops are not aware of the presence of the intrusion sensing system. The system should be resistant to false alarms from such things as animals, falling branches and the like, and should be effective without detectable emissions, thus to provide a completely covert or stealth system.

SUMMARY OF INVENTION

A robust, readily deployable, covert, passive intrusion detection system that uses virtually no energy detects the presence of an individual by the changes of the E-field that the individual produces as he moves across the ground. In one embodiment an E-field sensor is provided that is single-ended. In another embodiment two spaced-apart E-field sensors are used to develop a differential E-field output to permit noise canceling and for bearing detection. In a further embodiment, pairs of differential E-field sensors are orthogonally oriented for multi-axis bearing detection.

In one embodiment each of the E-field sensors is provided with a light-emitting covert or overt device that is triggered when the E-field sensor senses the presence of an individual. When these E-field sensors are distributed over an area, the presence and location of an intruder is indicated by the triggered light-emitting device, with location being optically observed. One blinking rate indicates proximity, whereas a different blinking rate indicates where the individual has been. Note that very little power is required such that the deployed sensors may last for years due to a deep sleep mode, with current drawn only upon detection of an individual. In a further embodiment an RF transmitter may be incorporated in each sensor that is keyed upon intrusion detection.

More particularly, E-fields in general are ubiquitous, exhibiting isopleths that are lines of equal electrical potential at the surface of the earth from a few volts up to thousands of volts. E-field sensors thus measure static electricity.

It has been found that most objects are electrostatically charged. A human being, for instance, walking across a floor, especially in dry conditions, may sometimes charge themselves up to 10,000 volts. Regardless of electrostatic charge build-up by walking on a carpet, especially in an outdoor environment, objects create a static charge in their own right. It has been found that moving objects engender measurable E-field intensity changes.

Thus as part of the subject of the present invention it has been found that one can actually detect E-field intensity changes for individuals moving across the ground. It is noted that the atmosphere has a potential gradient of approximately 100 volts per meter and that one can sense the change in gradient due to the presence of moving individuals.

What will be appreciated is that air has an extremely high resistance so that when one walks one does not feel the change in electric field. What has been found is that individuals change the potential of the space around the individual because the individual acts as a kind of electrical dead short compared to air. It is this change or tilt in the E-field that the subject sensors detect. In summary, if one has an E-field sensor and an individual is walking by the sensor, the individual is disturbing the normally flat field. It is this change in field called tilt that is sensed by the subject system.

Note that an individual acts as a conductor. The conductor formed by the individual's body is shorted to ground due to the capacitor formed between his foot and the ground due to his shoes.

When the individual puts both feet on the ground, this acts like a two-capacitance coupling to ground, with the area of the foot times the dielectric constant of the shoe providing for the capacitance. When one picks up one's foot, there is a sudden change in voltage by a factor of two because the capacitance is cut in half. Thus, as one walks, not only is one shorting out the electrostatic field by virtue of the capacitor effect, one changes the electrostatic field by one-half of the individual's height times the potential gradient. If one continually changes the electrostatic field as one foot goes up and the other foot comes down, a recognizable E-field dE/dt signature is produced.

Note when walking one has one foot up, then both feet are down and then the other foot is up. When one is running, one actually goes from one capacitance unit to a very, very small capacitance when neither foot is on the ground. Thus the capacitance is large when a foot is on the ground and is negligible when neither foot is on the ground. Thus, test results have shown when an individual is running, when both feet are off the ground at some period of time, one has a very large signature that can be detected, i.e., the difference in E-field disturbance between one foot and no feet.

Regardless of whether a moving person has one or both feet on the ground, with the subject E-field sensors one can detect the presence of a moving individual even when the individual is crawling and even with people in bare feet due to the body sway during walking.

In summary, one can detect an individual moving through the static electric field, with the individual's movement altering the field by virtue of the fact that either the individual is directly shorted to ground or is a capacitance shorted to ground; or because the capacitance short to ground varies depending in the individual's stride.

As will be seen, it is possible to design E-field sensors that are exceedingly small in volume, operate with virtually no current so as to perform in essence as a very, very high impedance voltmeter and can signal the presence of an individual by driving a visual indicating device, such as infrared light-emitting diode, LED.

It has also been found that one can deploy such sensors by hand or either by firing dart-like projectiles from a cannon or by deploying aerial darts that are scattered over the theater of interest and are virtually undetectable.

When an individual comes close to one of these dart-carried sensors, the electrostatic field changes and for changes between 0.5 Hz and 8 Hz, which corresponds to the range of a human walking very slowly to sprinting, one can cause the light-emitting diode to blink.

If the diode is operating in the infrared region of the electromagnetic spectrum, the blinking is invisible to the individuals on the ground. By overflying the protected area, one can detect the presence of individuals by the rapid blinking of the sensors. The sensor location may also be established by visual geolocation using simple aerial photography or IR scanning techniques so that as the individual or individuals move past an area, the blinking tracks their movement from the air.

Additionally, it is not necessary to track individuals moving from the air but rather one can track movement from the ground using wide-angle infrared sensors.

In one embodiment of the subject invention, the light-emitting diodes or other light-emitting elements flash rapidly in the presence of a pre-determined change in the electrostatic field nearby, thus to indicate the presence of an intruder in real time. Thereafter, the LEDs may be made to blink in a less-rapid fashion to indicate the track of the individual through the protected area.

Each of the sensors may be provided with a small microcontroller that processes the data in real time and provides band pass filtering for the signals of interest, such as a human walking or running. When the sensor detects a signal with enough intensity, then the aforementioned infrared light-emitting diodes may be appropriately driven. This is especially useful with night vision apparatus to see that intrusion has occurred. If the individual is not carrying night vision goggles or the like, the individual does not even know that he or she has been detected.

In another battlefield scenario, it may be useful to provide visual indications of detection such as a flash so that the intruding individual is caused to panic, knowing that his presence has been sensed.

In another embodiment, the presence of an individual that has been sensed by the E-field sensor is communicated over, for instance, a 10-milliwatt, 900-MHz communications link invoking a transmitter carried by the sensor. In this embodiment the sensor includes a microcontroller chip, with the transmission being FSK encoded so as to be reasonably immune to other noise sources.

It is also possible to provide the sensor with a visual LED, an IR LED and an RF transmitter, with all three being built in.

The entire sensor may be powered by N-size batteries, in which the sensor is put in sleep mode between the times that one takes samples, with two N batteries able to provide lifetimes in excess of three days of activity when people area actually trying to intrude. However, two batteries can in fact keep the sensor alive for as long as three years, depending on the type of sleep mode used.

The advantage of the subject system is that it is totally passive and extraordinarily low power. It is noted that when an RF transmitter is used it is only necessary to key the transmitter when an intrusion has been detected. In this case the sensor circuit alone may only draw in the region of single micro-amps of power.

The presence of the intruder is quickly known by virtue of the illumination of the LEDs carried by the sensor so that one instantaneously knows the position of the intruder without complicated triangulation. In one tactical scenario, with night vision goggles or other apparatus, while the intruder cannot see anything, those looking for the intruder see a kind of firefly display from which the presence and location of the intruder can be ascertained.

The result is that one does not need a complicated geolocation system to be able to locate individuals.

If one wanted geolocation, one could overfly the protected area with drones such as the Predator aircraft. Since the location of the drone is known by virtue of on-board GPS, the drone can perform range and azimuth computations from the on-ground LEDs, with laser designation used to obtain the actual range. With these measurements the drone-based data can be converted to latitude and longitude within a few feet. Thus, if one had a large area about which the sensors had been deployed, one could obtain the coordinates of the intruder and launch appropriate ordnances such as artillery shells or mortar rounds.

In terms of reliably detecting individuals as opposed to other artifacts including animals, it has been found that band pass filtering for E-field variations from 0.5 Hz to up to 8 Hz is effective. It turns out that most animals do not give a response in the above range.

It is noted that if the person is stationary, then there is no change in E-field due to the presence of the individual. However, when a person walks from a very slow walk to a run, one has a 0.5 Hz to 8 Hz range of E-field signature.

As to the E-field sensor itself, one type of E-field sensor is described in the aforementioned US Patent Application Serial No. US2002/039,436 filed Feb. 12, 2003 by Paul A. Zank entitled "Electric Field Sensor" and is incorporated herein by reference.

Moreover, each of the sensing elements or antennas may merely be a metal pad. However, in a preferred embodiment each antenna is provided with a scheme of guarding the antenna with an electrical guard that keeps the effective impedance extremely high, the equivalent of terrohms of input impedance. This means that one can use as an antenna an extremely small pad in which the antenna itself may be nothing more than a miniscule printed circuit pad. Also, the extremely high impedance magnifies the E-field effect by causing a current to flow through a terrohm resistance.

In order to keep the impedance of the antenna extremely high, it is desirable to provide a guard around the input to the pre-amplifier used.

The reason that it is important to maintain the impedance of the antenna extremely high is to make it possible to make a pad about the size of a pencil eraser. However, other components and circuitry result in capacitance between the input lead and the amplifier that lowers the effective impedance of the antenna.

Note that the pad is a conductive surface, even if the conductive surface is an extremely thin and transparent 10 megohms/inch conductor. For the present purposes, a 10 megohms/inch conductor is an excellent conductor, whereas for other purposes it would be unacceptable. Note that the input impedance for the amplifier used is so high that 10 megohms/inch makes the antenna pad look like a good conductor. Thus one can use a gold film for a conductor for the antenna that is so extremely thin that it is transparent and cannot be seen.

As to the guard itself, the guard may be any kind of metal shield around the conductor from the antenna to the input of the pre-amplifier or operational amplifier. The output of the amplifier is slightly reduced and fed back to the guard. What this does is that at no time is there any significant potential difference between the input lead and the guard. This dynamically reduces the stray capacitance to near zero, which is needed to be able to have an exceedingly small E-field antenna.

Rather than using E-field sensors that may be tens of inches on a side and very bulky, one can use extremely small E-field sensors provided with the requisite sensitivity by having the potential difference between the input lead and the guard to be zero. This keeps the effective impedance extremely high. What this means is that one can match the impedance of the exceedingly small antenna to the ultra-high input impedance of the amplifier. Thus there is a good match between the high-impedance input to the amplifier and the high-impedance very small antenna.

Note that amplifiers rarely operate in the terraohm impedance range. For proper performance one needs an exceptionally high input impedance amplifier. Normally the input impedance would be decreased by the capacitance that it has to all of the other components around it. However, one does not let the amplifier or the antenna see these components so that it in essence cannot see the other traces or components on the board.

It will be appreciated that the shield does not act like coaxial cable because this implies that the shield is grounded. Rather, the shield is not grounded but is actively driven.

Given this type of sensor with the guard technique, it is possible to provide magnitude-only sensors in which there is only one antenna. One could also provide spaced-apart differential sensors to cancel out noise and 60 cycle fields, or to provide bearing to the source of the E-field tilt. The spacing in general is to exceed 2 to 3 times the width of the pad that serves as the antenna.

When using a differential two-patch sensor, one sees the charge being closer to the patch on one side as opposed to the charge on the patch on the other side. If, for example, there is a positive charge coming in on, for instance, the left-hand side, electrons want to rush over to the left-hand side to try to neutralize these charges. The electrons run through the extremely high impedance. Even though there are only a few electrons moving, with a 2 terraohm resistor, this generates a significant voltage, in one embodiment equivalent to a couple hundred terraohms.

Thus the slightest movement of electrons trying to cancel out the charge is what is detected.

This is the situation in which two spaced-apart detectors are on a single line. If one orients an additional pair orthogonal to the first two pair, one can perform a dual-axis differential measurement.

The differential sensor has two very different advantages. The first is that it cancels out random noise in the background at 60 Hz. If the 60-Hz source is far away, both sides of the antenna see it at the same time, so there is nothing differential in nature that is sensed.

Secondly, with additional processing one can also detect bearing to the suspected phenomenon.

In summary, a robust, easily deployable, covert, passive intrusion detection system uses one or more E-field sensors to detect the presence of a moving individual and to provide an indication of the presence of the individual adjacent the sensor based on E-field distortion produced by the individual. Single-ended and differential E-field sensors with noise canceling and a guarding circuit provide sufficient sensitivity, with filtering from 0.5 Hz to 8.0 Hz selecting only human intruders. Either visible or invisible flashing light sources at the sensor indicate the presence of a moving individual at the sensor, thus to provide intruder location without the necessity of providing a geolocation system.

BRIEF DESCRIPTION OF THE DRAWINGS

These and other features of the subject invention will be better understood in connection with a Detailed Description, in conjunction with the Drawings, of which.

DETAILED DESCRIPTION

Figure 1:
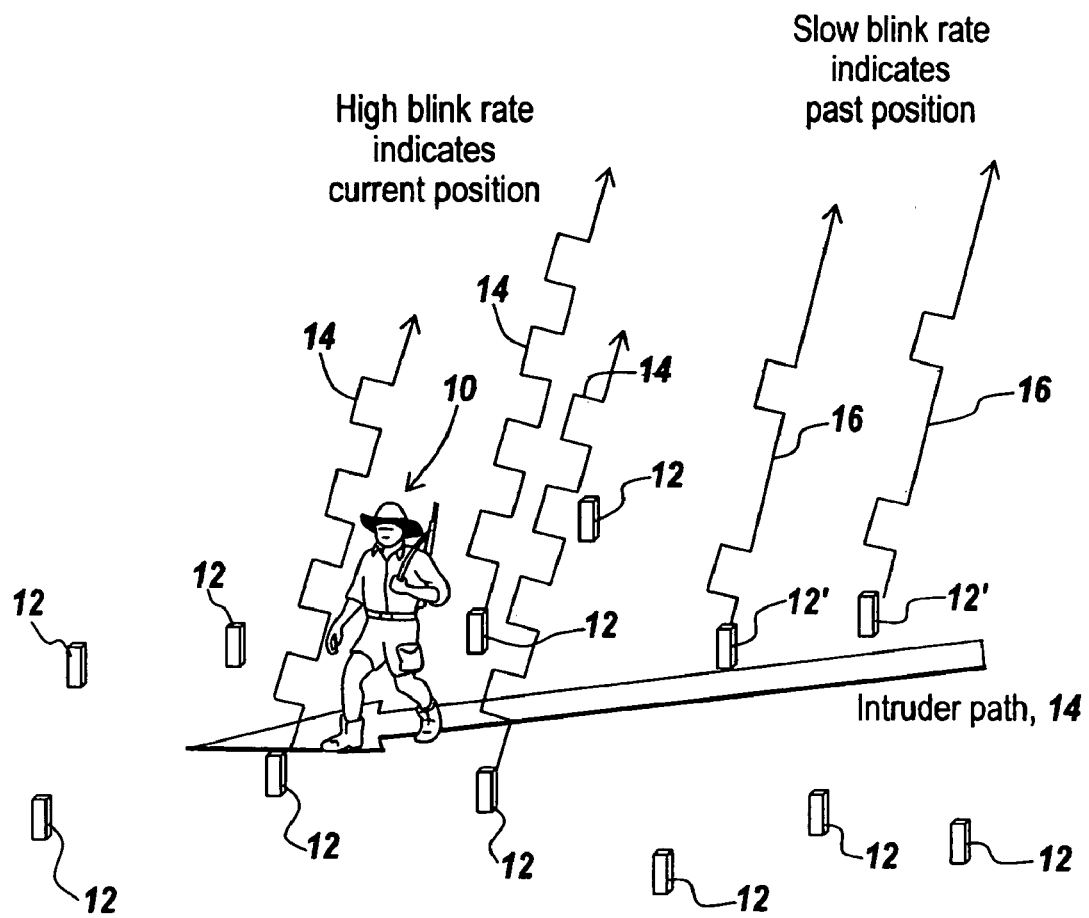
FIG. 1 is a diagrammatic illustration of E-field sensors scattered about terrain for indicating the presence of an individual through the use of light-emitting diodes, which provide a high blink rate indication due to the proximity of the individual and a slower blink rate indicating past position.

Referring now to FIG. 1, it is the purpose of the subject invention to be able to detect the presence of a moving individual 10 as he moves past E-field sensors 12 that are scattered about the terrain over which the individual walks or runs.

The general path of the individual, intruder path 14, is illustrated, which shows that the individual has moved past some of the sensors, is at some of the other sensors and is moving towards further sensors.

When the sensor detects an E-field tilt corresponding to the presence of an individual within a predetermined perimeter, the sensor emits in one embodiment a pulsed or blinked LED signal 14 to indicate the presence of the individual within a small distance from the sensor. As will be appreciated, these firefly blinking signals can be observed either from above or from ground level and indicate intrusion into the zone protected by the scattered sensors. It is noted that it is not necessary to know the location of the scattered sensors because their location will be immediately apparent from the blinking signal and the location of the blinking signal when viewed either from the ground or from the air.

As the individual 10 moves past sensors, then as indicated by sensors 12', the blinking rate originally associated with the individual having past in proximity to the sensor is slowed, as indicated by wave forms 16, to indicate the path that the individual has taken so that one can trace the direction from whence the individual has come.

It has been found that the sensor range for a slow-walking human being is on the order of 30 feet or more, depending on the sensitivity of the sensor and, for instance, whether or not the sensor is single-ended or differential.

While as presented the indication of the presence of the individual is done through the blinking LEDs, as will be seen hereinafter, it is also possible to provide the sensor with RF communications equipment to be able to radio the existence of the individual to a remote location. The sensor may in this case be provided with a geolocation device or the position of the sensor may be determined by other means.

Figure 2:
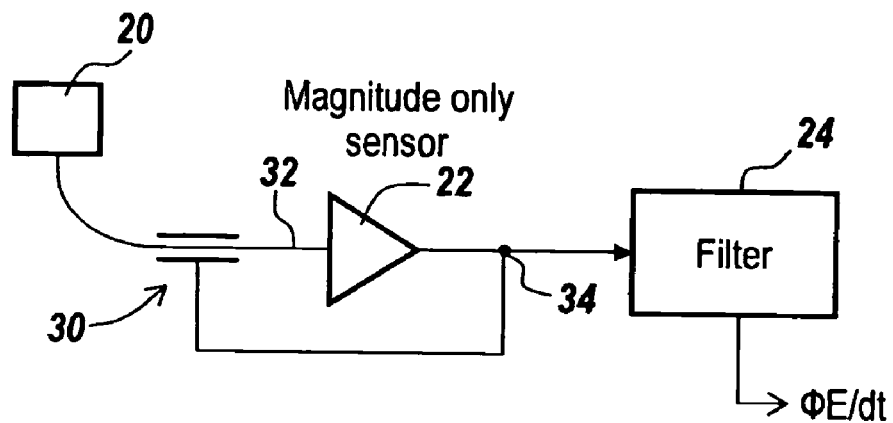
FIG. 2 is a schematic diagram of a single E-field sensor for using the magnitude of E-field change to detect the presence of an individual.

In order to be able to sense the presence of the individual passively, and as illustrated in FIG. 2, the E-field sensor includes an antenna or pad 20 coupled to an amplifier 22, the output of which is filtered at 24 to provide an indication of a change of E-field, here indicated by dE/dt. It is not necessary to differentiate the signal but merely to sense a change in the E-field in order to sense the presence of an individual.

Also as indicated, a guard shield 30 is provided around the lead 32 between pad 20 and amplifier 22, which is tied to an output 34 of amplifier 22. The purpose as mentioned hereinbefore is to assure that the input impedance of the amplifier is extremely high and matches that of the pad serving as the antenna. When there is no potential difference between the guard and line 32, then all stray capacitance will have been canceled out and the extremely high impedance antenna is now matched to the extremely high impedance amplifier.

Figure 3:
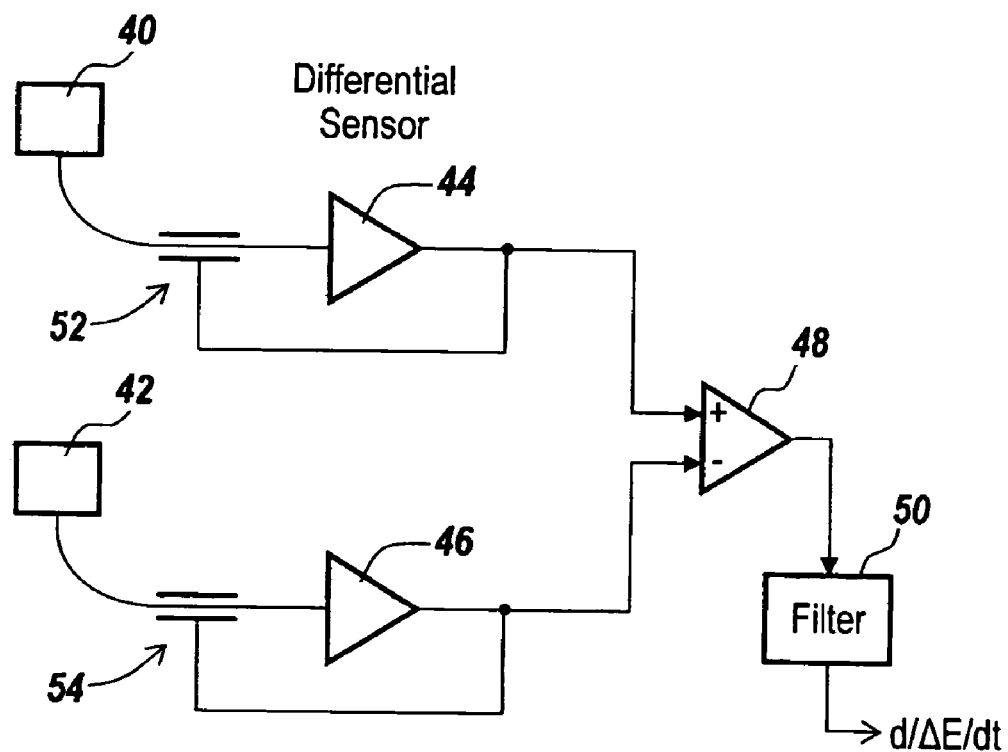
FIG. 3 is a schematic diagram of a differential E-field sensor for sensing the presence of an individual.

Referring to FIG. 3, in a differential sensor case, the circuit of FIG. 2 is duplicated such that one has in essence two spaced-apart antennas 40 and 42 coupled to respective amplifiers 44 and 46, having their outputs coupled to the differential inputs to a differential amplifier 48. The output of differential amplifier 48 is filtered at 50 so as to provide an output that is dΔ/dt, meaning that the absolute value of the difference in the signals arriving at antennas 40 and 42 is that which rides the indication of the change of E-field or the tilt of the E-field.

The use of the differential sensor cancels out steady-state 50/60 Hz signals and any noise that arises from the far field. Thus, that which is sensed by the system is only that due to the change in E-field. It has been found that the spacing of the antennas is in general more than three to four times the lateral width of the pads.

As in FIG. 2, the FIG. 3 embodiment includes guard circuits 52 and 54.

Figure 4:
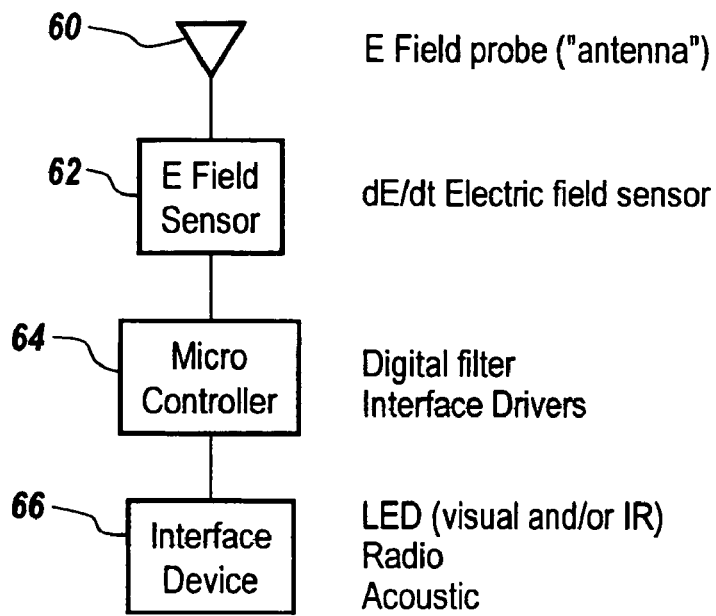
FIG. 4 is a block diagram of an E-field sensor system including the E-field sensor, microcontroller and an interface device for interfacing an alarm or intrusion-sensing event.

Referring now to FIG. 4, the E-field sensing system for intrusion detection includes an E-field probe or antenna 60 coupled to an E-field sensor 62, which determines the change in the E-field either by differentiating the output of the sensor with respect to time or otherwise, with the electric field sensor being coupled to a microcontroller 64, which performs digital filter and interfacing functions. Microcontroller 64 is coupled to an interface device 66, which may be a visual and/or infrared indicator such as an LED, a radio transmitter or even acoustic projection means.

Figure 5:
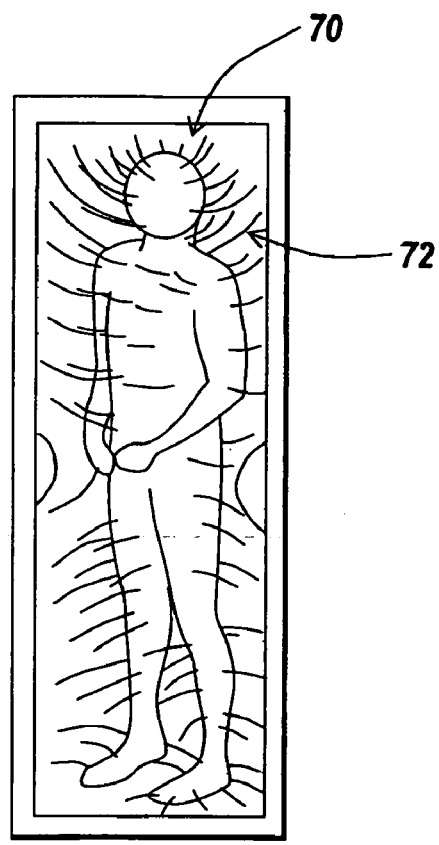
FIG. 5 is a diagrammatic illustration of the distortion of the E-field by the presence of an individual in which the individual presence a short to ground capacitively coupled through the individual's shoes.

Referring now to FIG. 5, an individual 70 is shown distorting the normal isopleths or lines of force as illustrated by the distorted lines 72. As mentioned hereinbefore, this is due to the fact that the individual in essence constitutes a short to ground, which is capacitively coupled through his shoes. As mentioned hereinbefore, if the individual is barefoot, the swaying motion of the individual as he walks will alter the E-field enough for detection. Note that with the E-field sensors described herein, the detection range of moving people may be as great as 60 to 75 feet.

Figure 6:
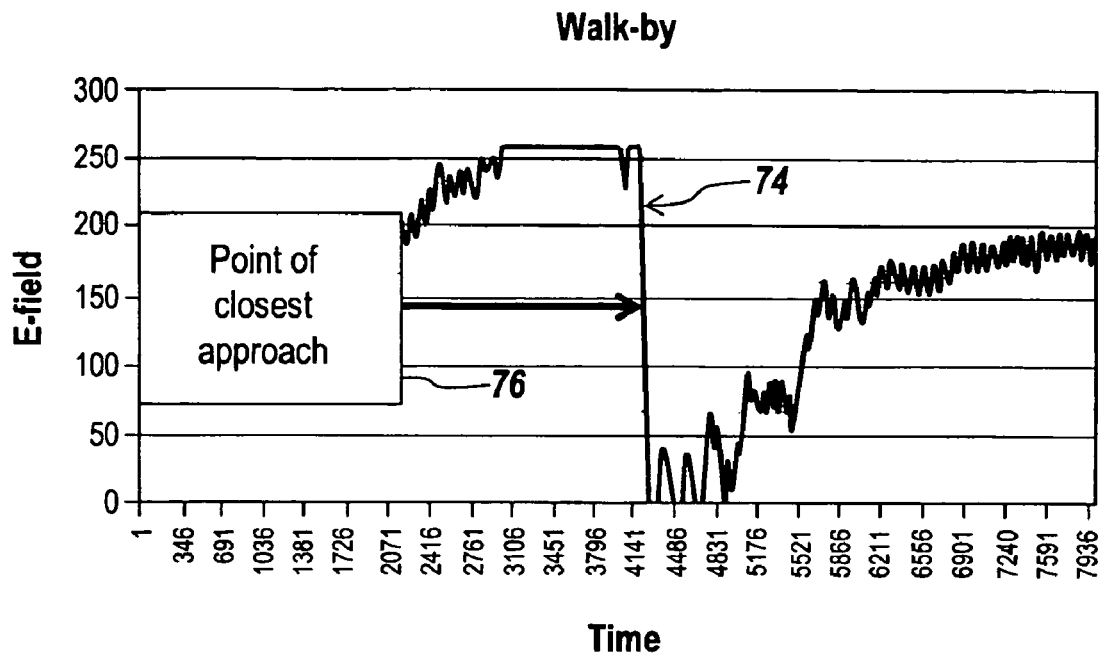
FIG. 6 is a graph of the output of an E-field sensor during a walk-by of an individual, illustrating the point of closest approach.

Referring now to FIG. 6, what will be seen is that if one graphs the sensed E-field against time as a person walks by the sensor, there is a distinct point of closest approach when using the aforementioned differential sensor. This is significant because the presence of the individual is clearly indicated by some characteristic of the sensed E-field.

One could clearly identify this as a signature and act upon it to activate the sensor indicator.

Figure 7:
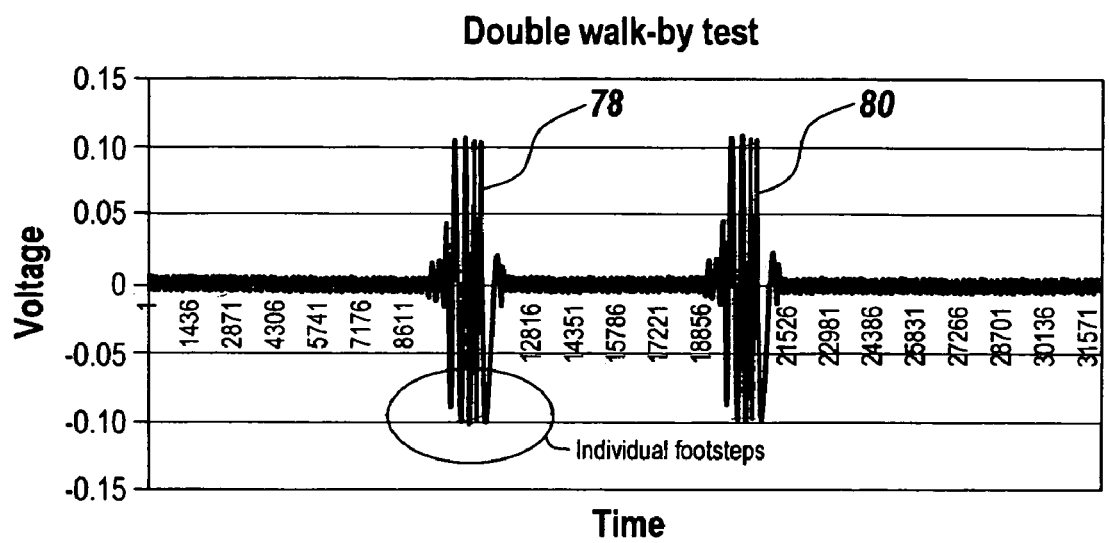
FIG. 7 is a graph of data collected in terms of voltage versus time of a double walk-by test in which the AC output of the E-field sensor is connected to an oscilloscope, showing individual footsteps of the individual as the individual passes the E-field sensor.

Referring to FIG. 7, as mentioned hereinbefore, the frequency of the change of the E-field for an individual walking or running is somewhere between 0.5 and 8.0 Hz. When coupling the output of the E-field sensor to an oscilloscope, one can clearly see the variation of the E-field due to first one foot and then the other foot contacting the earth, which provides a characteristic waveform indicating the presence of an individual who is walking. The peaks and valleys of the voltage applied to the oscilloscope indicate the presence of an individual by the fact of regular steps, which is confirmed when the individual turns around and walks by the sensor again as shown respectively by waveform portions 78 and 80.

Figure 8:
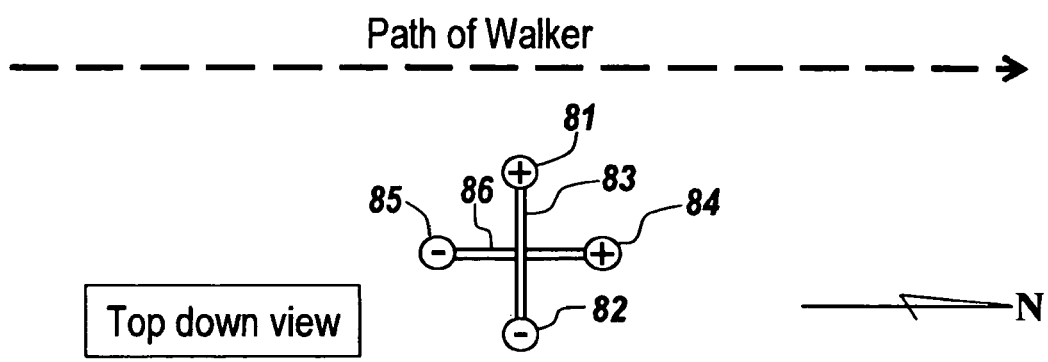
FIG. 8 is a diagrammatic illustration of a two-axis differential E-field sensor antenna configuration for detecting the presence of and bearing to an individual walking past the sensor.

Referring now to FIG. 8, what is shown is a two-axis differential antenna configuration viewed top-down in which one pair having antennas 81 and 82 located along a line 83 are located orthogonal to a second pair of differential sensor antennas 84 and 85 positioned along orthogonal axis 86. The purpose of the double differential or two-axis differential arrangement can be seen in terms of determining the bearing to an individual walking by the sensor.

Figure 9:
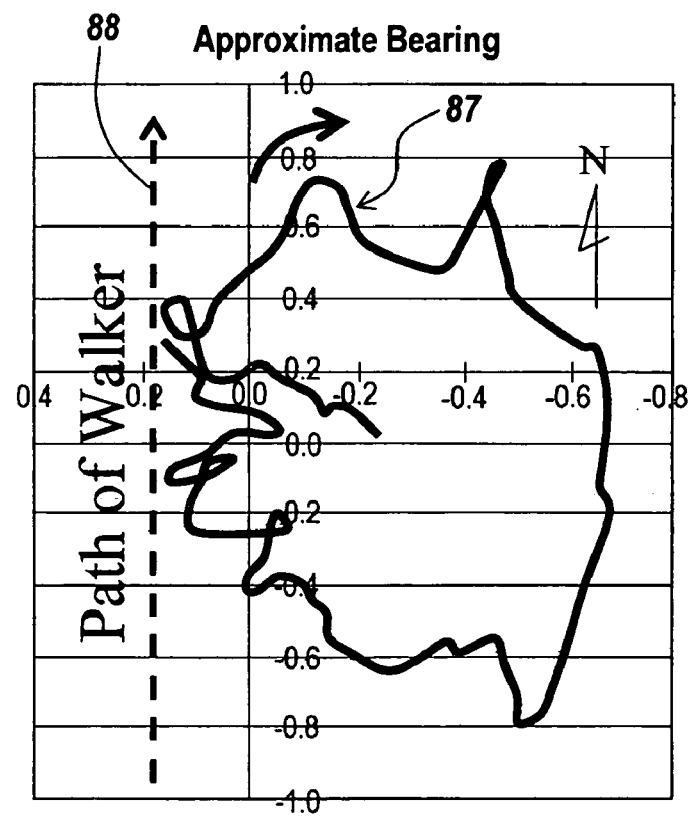
FIG. 9 is a graph of the approximate bearing of the individual relative to the sensor as the individual walks by the sensor, with the graph showing the projection of the E-field vector onto the X-Y plane.

As illustrated in FIG. 9, the approximate bearing 87 of an individual walking along a path 88 is illustrated, in which what is graphed is the approximate bearing of the walker that is the inverse of the E-field vector or more particularly it is the projection of the E-field vector onto the X-Y plane.

What is shown by this graph is that it is possible to detect not only the presence of the intruder but also the bearing of the intruder to the sensor should, for instance, there not be a sufficient number of sensors deployed to be able to locate the presence of the individual and his location with sufficient accuracy.

Figure 10:
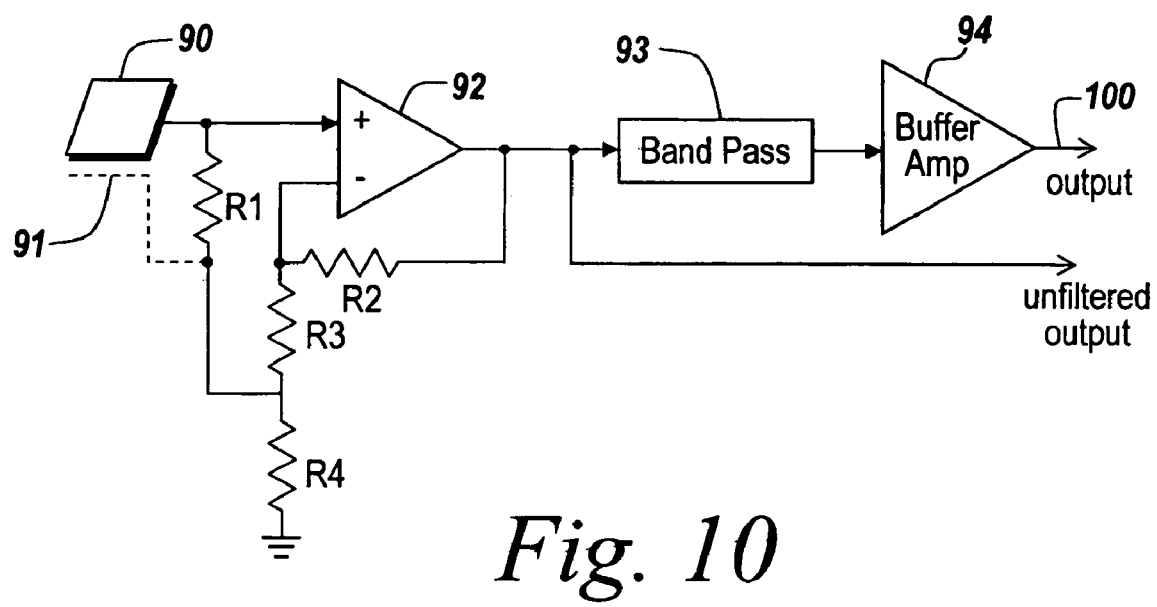
FIG. 10 is a schematic diagram of a single-ended E-field sensor with guard circuitry for canceling out stray capacitance from the circuit and other elements.

FIG. 10 is a block diagram representing a simple embodiment of a sensor used for detecting E-field distortions illustrating the circuit arrangement as well as the interconnection of the inputs and outputs. The sensing area 90 or "antenna" is a small conductive element.

The sensor area 90 in FIG. 10 can essentially be regarded as one side of a capacitor with the remainder of the sensor being the charged source or even the earth's field being the source. The larger the area the greater the sensitivity, however interference and extraneous signals become problematic if the sensitivity is too high. In one embodiment the pad is approximately 1/30 inch squared and picks up signals as low as 200 microvolts. Experimentation of other sensing areas from about 1/10 of a square inch to several inches has resulted in different data measurements and the size of the antenna depends upon the application and environmental conditions.

There is a guard area 91 proximate the sensing element that functions to reduce the "capacitance." In one embodiment where the circuit is laid out on a printed circuit board, the guard area is a wiring board etch on the opposite side of printed circuit board opposing the sensing area 90. The guard 91 primarily eliminates the capacitance of the shield, such as coax cable, thereby greatly increasing the antenna 90 impedance. In one embodiment the sensing element 90 is designed for maximum input impedance with a partial Faraday shield covering a portion of the sensing area 90 to reduce the gain.

Thus, the size of the sensor area 90 is one method to adjust system gain, while another adjustment mechanism is the shielding. Subsequent signal processing and filtering is used to reject unwanted signals, for example, narrow pulses or relatively high frequency signals such as those caused by lightening, arc welders, and RF sources.

A differential amplifier 92 is used with bootstrapping to establish high impedance and provide amplification. The gain of the differential amplifier 92 is determined by the resistors R2, R3, and R4 and as is well known in the art, that the gain is equal to (R2+R3+R4)/(R3+R4). The resistors R3 and R4 determine the percentage of input signal that is coupled to one side of R1 and the guard 91. For example, R3=1k and R4=9k, the voltage at the junction of R3 and R4 is 90% of the voltage at the sensing area 90. In effect, R1 appears ten times larger, and the capacitance of the sensing area 90 to be ten times lower.

Expressed differently, if the voltage at junction 91 were 99.9% of that present at the sensing area 90, the R3 would appear 1000 times larger and the capacitance of the sensing area 90 would appear to be 1000 times smaller. Thus the ratio of R3 to R4 determines the input resistance to the amplifier 92. It is preferred to make the input impedance very high without having amplifier 92 saturate due to its input bias currents. Typical feedback ratios are from 90% to 99% while the value of R1 might be 10 Mohms, giving an effective input resistance of 100 to 1000 Mohms or more.

Figure 11:
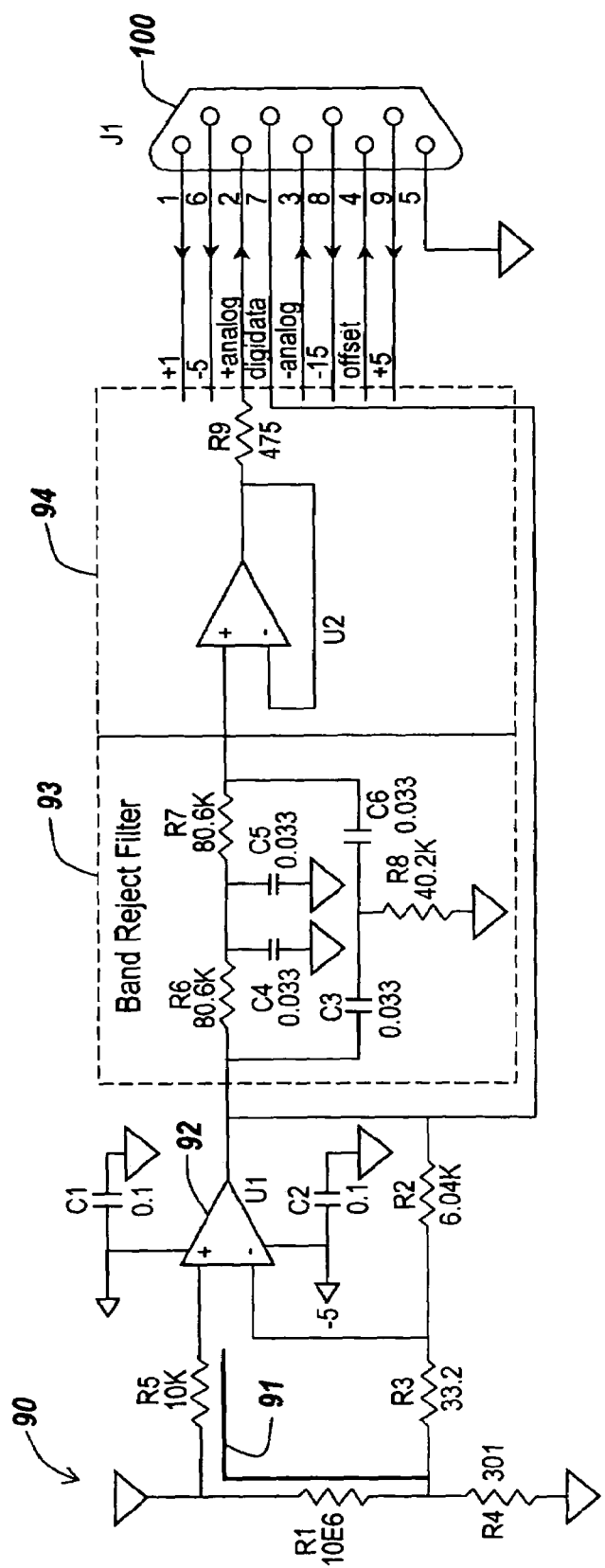
FIG. 11 is a detailed circuit diagram for the circuit of FIG. 10 for the single-ended case.

Referring to FIG. 11, in a preferred embodiment, the differential amplifier 92 is a field-effect operational amplifier U1 (op amp TLC2272) with bootstrapping to provide high impedance for the sensing element 90. In this circuit, the sensing element 90 is a small metallic piece that is part of the printed wiring board, such as an etch on the board. The sensing element signal is amplified and converted to a low source impedance. R1 is 10 Mohm, R2 is 6.04 Kohm, R3 is 33.2 ohm and R4 is 301 ohm. An additional resistor R5 may be connected between the sensing area 90 and the + input of the differential amplifier 92 of approximately 10 Kohm to provide amplifier protection.

A frequency filter 93 may be used in other applications when not looking to detect power lines. In this case filter 93 is a power line 60-Hz pass band filter used to pass the E field caused by power lines and is set to the power line frequency for the region of use, generally 60 Hz in the United States. In one embodiment, off-the-shelf commercial components are utilized to construct the filter 93. The 60-Hz pass band filter 93 is inserted to reject out-of-band signals.

A buffer amplifier 94 provides high input impedance to the filter 93 while providing additional gain and a low impedance source for the voltage measuring device. Typically the measuring device is a sample-and-hold circuit followed by an analog-to-digital (A/D) converter and subsequent processing circuitry.

The buffer amplifier stage 94 in one embodiment is a second field-effect operational amplifier U2 (op amp TLC2272) and is used to achieve an approximate gain of 20 dB. A 15 v DC power is supplied by a power source, such as common dry cell batteries, although any power source with acceptable output may be used. The output signal of the sensor device is delivered to the next stage of the detection system.

The sensor does not require unique components and persons skilled in the art will choose components that will enable optimal configuration to achieve the objectives of the sensor's application. The combination of the sensing elements and guard in conjunction with the bootstrapped differential amplifier and other elements enables the unexpected sensing of electric field disturbances in a wide array of applications.

Note when the tipping is relatively slow, the circuit of FIG. 10 is modified as shown in FIG. 11 to have the bandpass filter now converted to a band reject filter 93'. The obvious purpose of the notch filter is to notch out any AC power line-induced fields, with the frequency of the sensed E-field being in the low- or sub-Hz range.

Other noise-reducing techniques can be used to minimize background noise, once having removed 60 cycle AC components. Thus, as can be seen in FIG. 8, what is presented is a schematic of one circuit illustrating the component selection for the differential amplifier as well as the electrical interconnection. In this embodiment an off-the-shelf commercial components are utilized. A field-effect operational amplifier (op amp) U1 such as TLC2272 is used to perform impedance matching for the sensing antenna 90. In this circuit, the sensing antenna 90 is a small metal pad on a printed circuit board with a corresponding guard 91 on the opposite side of the board. The effective antenna impedance is approximately 1000 Mohms and the sensing area signal is amplified to a low (≅90 ohms) source by the amplifier U1. The bootstrapping interface discussed herein establishes the high impedance input and provides amplification.

A notch filter 93' is inserted to reject the 60-Hz E-field signals. The selection of components R6, R7, R8, C3 and C6 are selected as known in the art and other values are possible.

The second field-effect operational amplifier (op amp) U2 is used to achieve an approximate gain of 20 dB. DC power is supplied by common dry cell batteries in one embodiment. However, power can also be provided from an AC source after AC/DC conversion. Other power sources such as solar and coupling power from power lines have also been contemplated. The sensor device output signals are delivered to the next stage of the detection system (not shown) through a connector J1.

Figure 12:
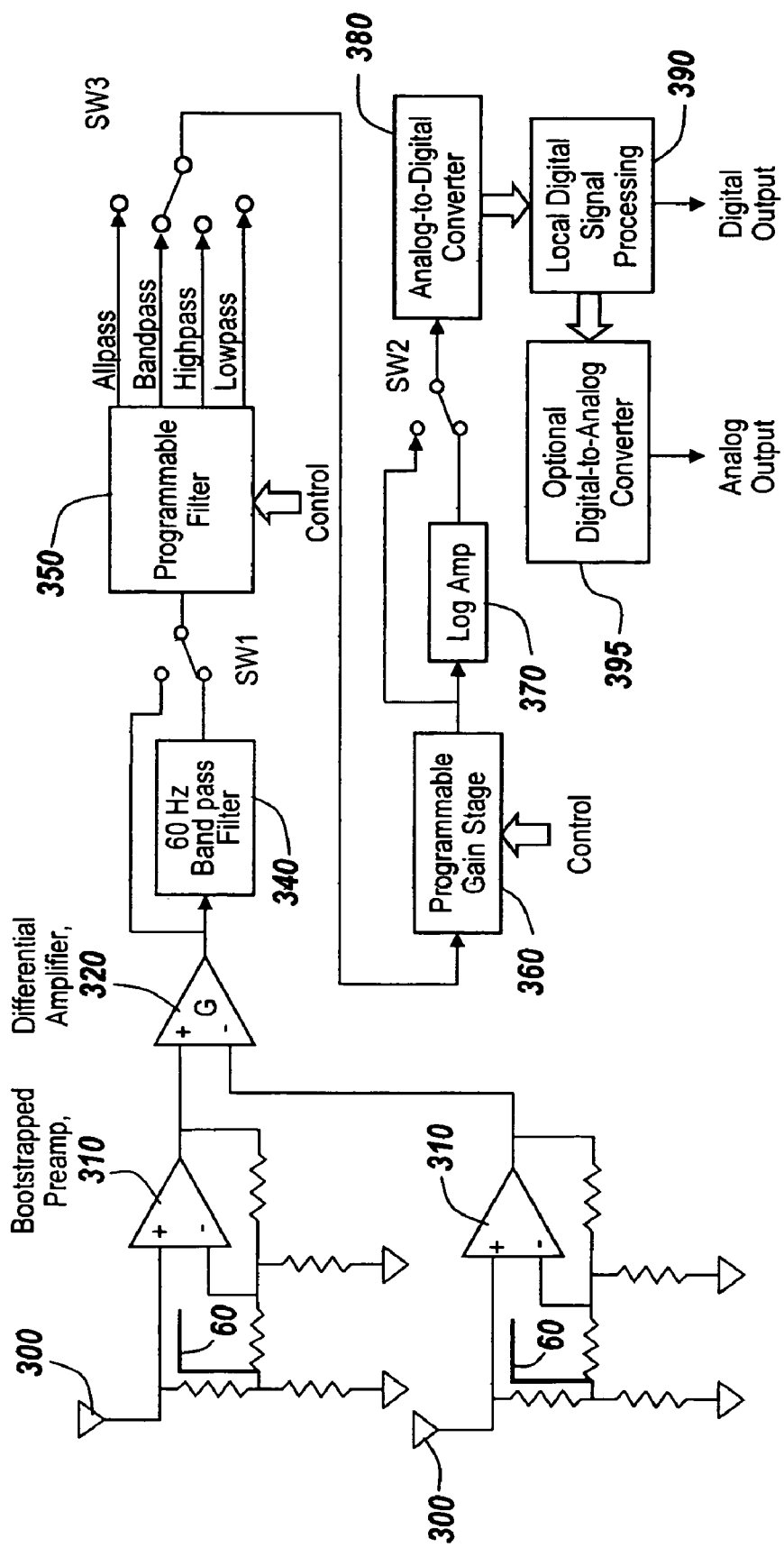
FIG. 12 is a detailed schematic diagram of a differential sensor embodiment, illustrating guard circuitry.

FIG. 12 shows one embodiment that encompasses dual sensors 300 for a differential field sensor and the signal processing requirements. It should be understood that the device can be run in single ended mode by grounding one antenna 300 which can allow for redundancy. The parallel connections allow the processing unit 390 to gather data from the multiple sensors 300 and process the data accordingly.

This embodiment employs two sensing elements 300 and two corresponding bootstrapped preamps 310 for boosting the input signal strength. The output of the preamps 310 are connected to a differential amplifier 320 and 60-Hz bandpass filter 340. Filter 340 can also be bypassed by switch SW1. A programmable filter 350 and programmable gain stage 360, and logarithmic amplifier 370 (logamp) are employed to process and enhance the electrostatic signature of the detected source prior to its passage to the analog and digital converters 380 generating digital data representing the received signals. The digitized data is coupled to a processing unit 390 such as a microprocessor or microcontroller, which performs processing to configure the output signal parameters for use by the next stage of the detection system. An optional Digital-to-Analog converter 395 can be used to re-convert the digitized data to analog form in order to have the raw data presented to the user.

In this embodiment the programmable filter 350 includes an Allpass, Bandpass, Highpass and Lowpass filtering depending upon the application. The selectability of filtering via switch SW3 allows flexibility in isolating the signal of interest as well as eliminating interfering noise. The programmable gain stage 360 permits variable boosting of the received signal. The log amp 370 boosts the signal depending upon the input level to a level satisfactory for further processing. In this embodiment the log amp stage 370 can be bypassed by switch SW2. The control to the programmable filter 350 and gain stage 360 are commands from the local signal processor although external commands via hard wired or wireless are within the scope of the invention. The output of the differential field sensor is delivered to the next stage of the detection system at the digital output terminal.

In one embodiment, the processing unit 390 has internal memory (not shown) or connection to external memory that stores the measured data. The output data can also be stored to establish a library of E field signatures that allow for classification and identification of measurements. This stored data is useful when comparing the present measurements to the existing database. For example, the signature of a certain event can possibly be matched for future measurements.

As discussed herein, coherent processing from multiple sensors of a single measurement greatly improves the measurement capabilities by reducing the impact of noise and interference. The coherent processing is described in detail in related application U.S. application Ser. No. 10/256,812, filed Sep. 27, 2002, which is incorporated by reference.

The coherent noise reduction works because the background noise is "far field" and low frequency. This means that two sensors placed apart see exactly the same background noise. If the signal of interest is in the near field, (less than 100 feet in one test) the sensors see the signal of interest at different signal strengths. When the two sensors are subtracted, the background noise disappears while some of the signal of interest remains. No knowledge of the background noise is required. This technology is well known to those skilled in the art and is applied to noise reduction head sets and microphones. This is distinguishable from bandpass filters, low pass filters, and high pass filters, that essentially reject interfering signals within a certain frequency. Bandpass filters reject signals in a certain frequency band. High pass filters reject lower frequency signals while allowing higher frequency signals. Low pass filters allow certain lower frequency signals while rejecting high frequency signals.

The noise reduction processing can be shown by the following equations for two sensors:

S1(t) is the total signal received at sensor 1
S2(t) is the total signal received at sensor 2
P1(t) is the signal at S1 from the signal of interest
Nb(t) is the background noise (assumed to be far field and therefore the same at
both sensors)
P2(t) is the signal at S2 from the signal of interest
S1(t)=Nb(t)+P1(t)
S2(t)=Nb(t)+P2(t)
P2(t)=kP1(t)
k<1
Sdiff=S1(t)−S2(t)=(Nb(t)+P1(t))−(Nb(t)+P2(t))
Sdiff=P1(t)−kP2(t)
Sdiff=(1−k)P1(t)

The signal of interest is somewhat reduced in strength but background noise is essentially eliminated. Thus signal to noise ratio (SNR) is greatly improved.

Figure 13:
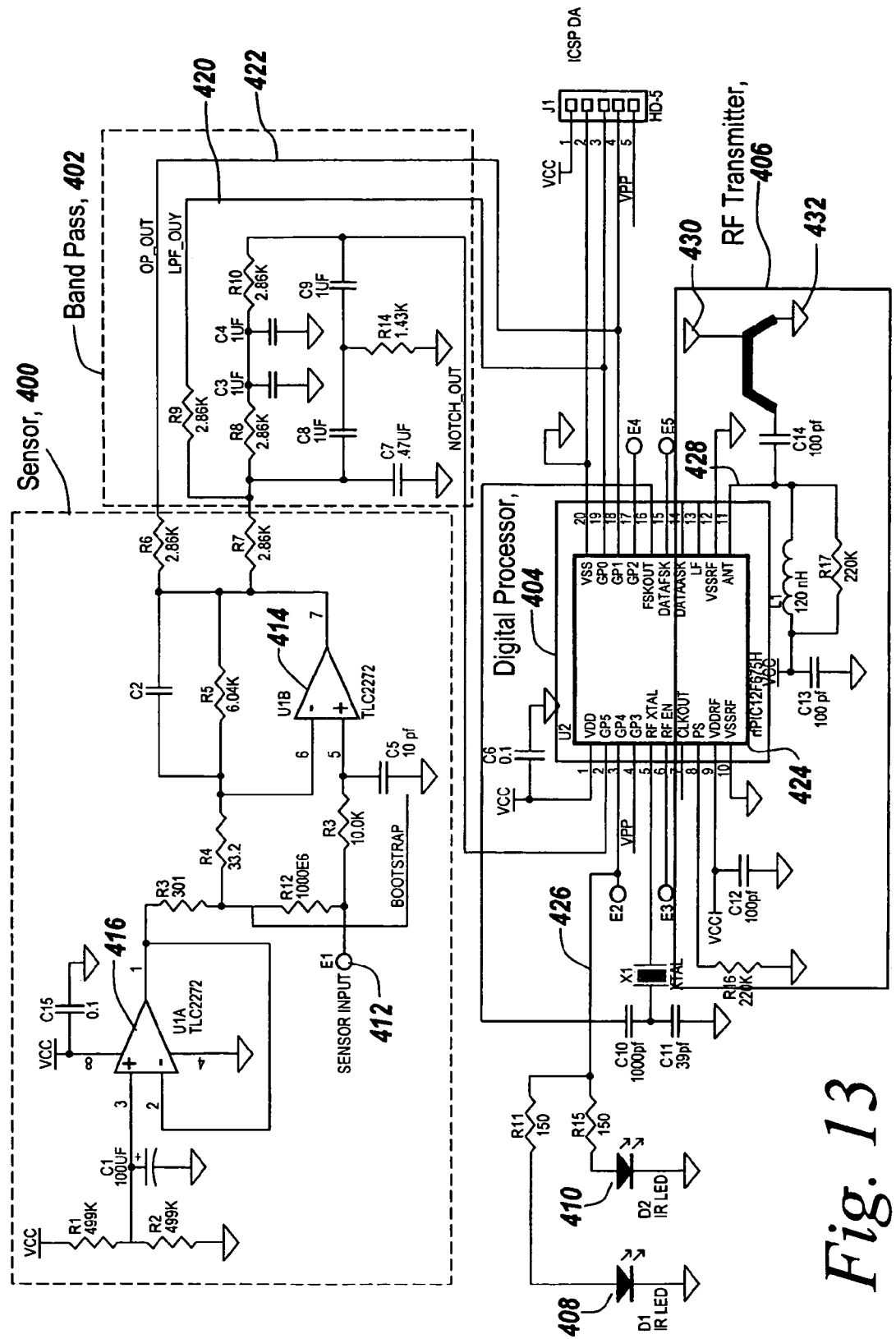
FIG. 13 is a detailed schematic diagram of a bootstrapped sensor coupled to a bandpass filter, in turn coupled to a digital processor that produces a drive for LEDs to indicate the presence of an individual, as well as an RF transmitter to indicate the presence of an individual by RF transmission.

Referring now to FIG. 13, in one embodiment of the subject invention the sensor module includes a sensor section 400, a bandpass section 402 and a digital processor 404, which includes circuitry to drive an RF transmitter section 406. Note that digital processing section 404 is used to drive a visual LED 408 and an infrared LED 410.

As to sensor 400, the sensor input 412 is applied in a bootstrap operation to a differential amplifier 414 in much the same manner as described in FIG. 11, with differential amplifier 416 and attendant circuitry used for providing a precise voltage reference, precisely ½ Vcc. Note that resistors $R_1$ and $R_2$ split Vcc in half and amplifier 416 is a straight voltage follower to provide the low impedance-source of the reference voltage.

Bandpass filter 402 performs the function as a 60 Hz notch filter on LPF out-line 420 and to provide filtered and unfiltered outputs on lines 420 and 422 respectively. The filtered and unfiltered outputs of the bandpass filter as well as the notch filter are applied to terminals 418 and 419 of digital processor 424 corresponding to GP0 and GP1.

The digital processor, as before, determines the presence of an intruder and drives LED 408 and LED 410 over line 426.

A crystal 428 controls the digital processor and also forms the basis for providing an RF signal out on line 428, which is the antenna output that drives antenna 430 through a matching arrangement 432. Note that Vcc is filtered by inductor L1, capacitor C13 and resistor R17, all of which constitute a tank circuit for the transmitter. This circuit smoothes out the digital output of the processor 404 to obtain a sine wave.

In one embodiment the transmission to a remote location indicating the presence of an individual is accomplished using either an FSK link or an ASK link so that the module depicted in FIG. 13 can provide one of three intrusion detection functions, namely visual, infrared or RF. Note that the indicators listed above need only be drive upon detection of an intruder.

Figure 14:
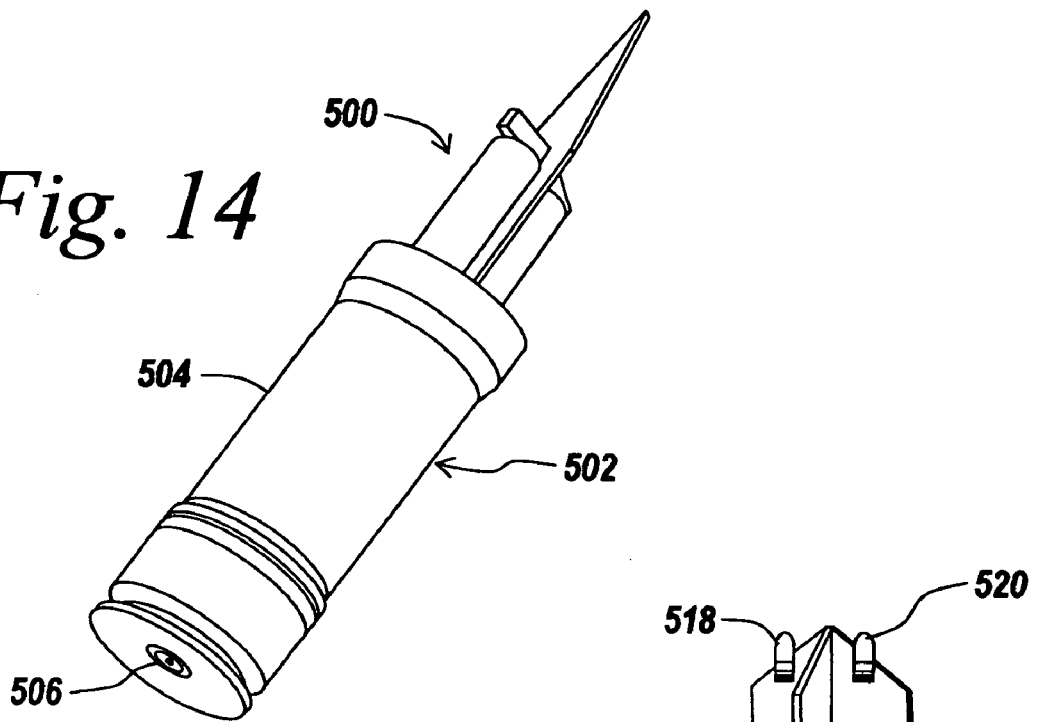
FIG. 14 is a diagrammatic illustration of a launchable sensor from an M203 40-mm grenade launcher, illustrating the dartlike proximal end adapted to stick into the ground and housing the subject E-field sensor.

Referring now to FIG. 14, in order to be able to deploy the subject intrusion sensors over a wide area, the sensors may be carried in a dart 500 that is launched by a grenade launcher 502 that propels dart 500 out of a shell casing 504 when the trigger pin contacts trigger 506 in the center of the shell.

Figure 15:
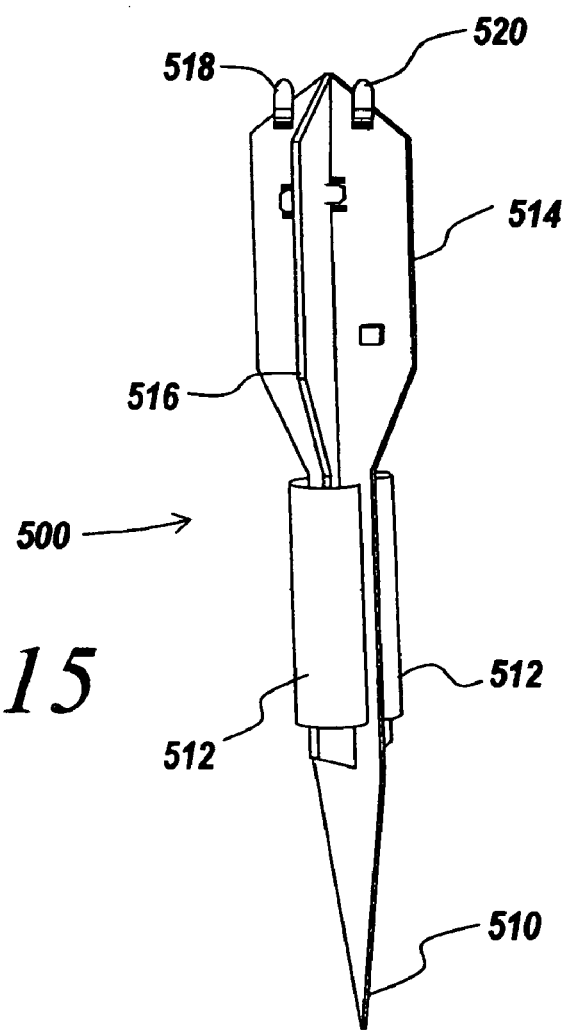
FIG. 15 is a diagrammatic illustration of the dart carried by the shell, illustrating the proximal end, the housing for the batteries, and dartlike finned printed circuit boards carrying the E-field sensor and the corresponding light-emitting diodes after having been fired; and, FIG. 16 is a graph of test data from a slow-walking individual past the sensor of FIG. 15.

As illustrated in FIG. 15, dart 500 includes a sharpened tip 510, batteries 512 and a pair of orthogonally-oriented circuit boards 514 and 516. These two orthogonally-oriented circuit boards are configured to provide fins to stabilize the dart during flight and to assume that the dart has a controllable trajectory that leaves it stuck in the ground point down. Note that batteries 512 weight the dart to achieve ground penetration.

Printed circuit boards 514 and 516 carry the aforementioned sensor and control circuits, with LEDs 518 and 520 respectively providing light in either the visible region of the electromagnetic spectrum of in the invisible region of the electromagnetic spectrum.

With numerous of these darts deployed over a terrain to be surveilled, one can detect and track the existence of an individual due to the illumination of the LEDs.

Figure 16:
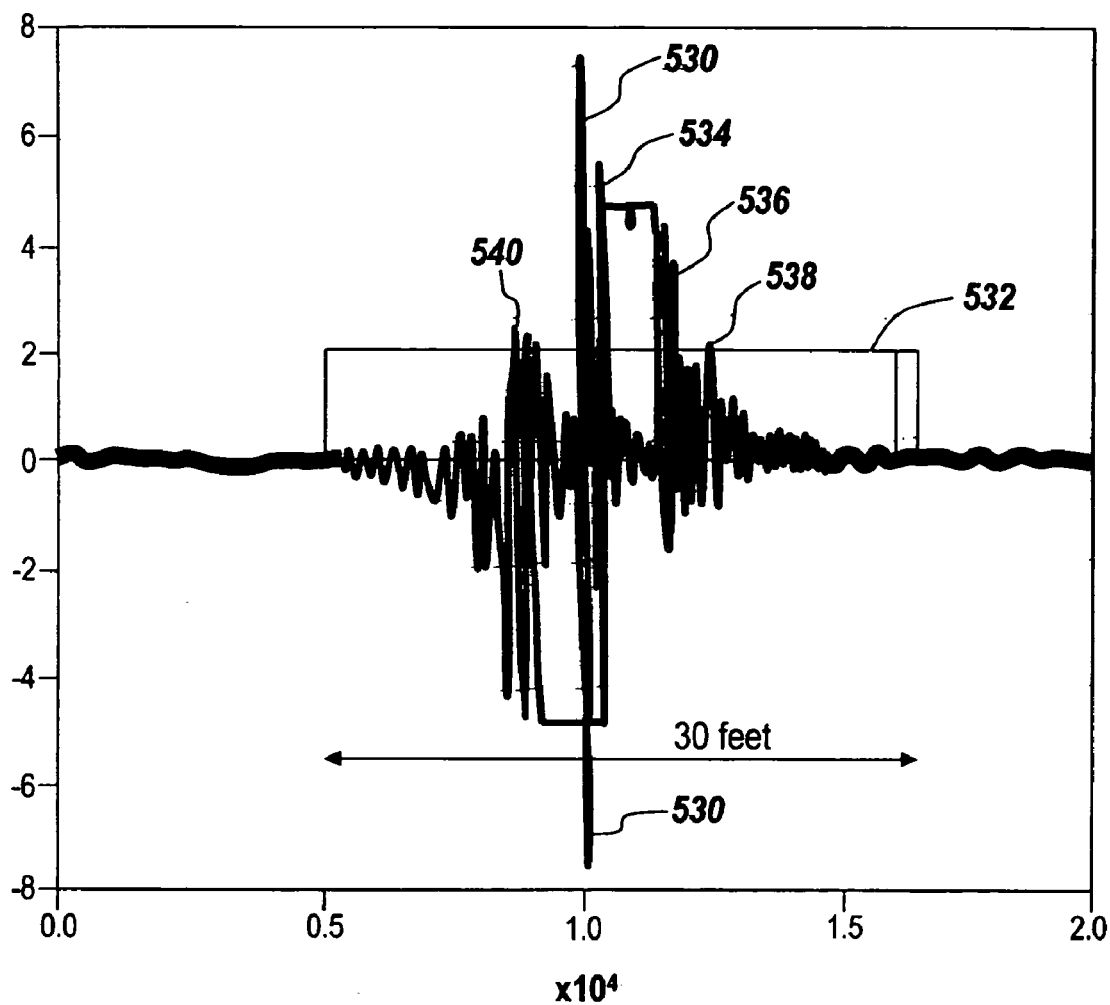

Referring to FIG. 16, test data for a differential E-field sensor carried by a dart is shown to indicate the detection of an individual within +/−15 feet of the dart. Note that the point of closest approach is shown by spikes 530, which exceed a threshold set as indicated by line 532. Note also that spikes 534, 536, 538 and 540 exceed the threshold set at 532.

What will be apparent is that the presence of an individual moving with respect to the sensor may be detected in terms of the distortion or tilt of the E-field near the sensor, such that not only can the presence of an individual be sensed, a signature corresponding to the individual's footsteps can also be derived.

As part of the subject system, light-emitting diodes are used at the sensor's location to indicate, when driven, the existence of the individual in the vicinity of the sensor as well as the path of the individual through the sensor field. Thus it is a part of the subject invention to indicate intrusion without having to use geolocation techniques by merely observing the illumination of the LEDs or other light sources carried by the sensors.

As mentioned, the system is totally passive, it being possible to make the communication of the individual's position totally invisible to the individual. Thus the subject system is a totally passive system in which no radiation need be generated in order to detect intruders.

While the present invention has been described in connection with the preferred embodiments of the various figures, it is to be understood that other similar embodiments may be used or modifications or additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A robust, easily deployable, covert, passive individual intrusion detection system, comprising:
a passive low-power E-field sensor including an ultra-high impedance antenna for sensing electrostatic field; and,
a processor coupled to said E-field sensor for detecting when a change in sensed E-field exceeds a predetermined threshold, indicative of the presence of an individual adjacent said sensor.

2. The system of claim 1, wherein said E-field sensor is a single-ended sensor.

3. The system of claim 1, wherein said sensor includes two spaced-apart E-field sensors and a differential amplifier coupled to the output of said spaced-apart E-field sensors to develop a differential E-field output, thereby to provide noise-canceling for far-field AC sources.

4. The system of claim 3, and further including an additional pair of orthogonally-oriented E-field sensors having an associated differential amplifier for multi-access bearing detection.

5. The system of claim 1, and further including a light-emitting device at said sensor, said light-emitting device activated when said threshold is exceeded.

6. The system of claim 5, and further including a drive for said light-emitting device for causing said light-emitting device to pulse at a predetermined rate upon said threshold being exceeded.

7. The system of claim 6, wherein said drive activates said light-emitting device at a different pulse rate after said threshold has been first exceeded and then later the sensed change in E-field signal goes below said threshold, thus to indicate that an individual has passed the sensor.

8. The system of claim 5, wherein said light-emitting device emits light in the visible region of the electromagnetic spectrum.

9. The system of claim 5, wherein said light-emitting device emits light in the non-visible region of the electromagnetic spectrum.

10. The system of claim 1, and further including a passband filter coupled to said sensor for passing through E-field change signals having a frequency between 0.5 Hz and 8.0 Hz, thus to sense E-field change due to an individual moving with respect to said sensor and to eliminate detection of E-field change due to non-human sources.

11. The system of claim 1, wherein said sensor includes an antenna lead, and an ultra-high impedance amplifier coupled to said antenna lead, and further including a guarding circuit around said antenna lead, a portion of the output from said amplifier coupled to said guarding circuit such that there is no potential difference between said lead and said guarding circuit, whereby the input capacitance of said ultra-high impedance amplifier is not diminished by any stray capacitance from surrounding circuits or conductors, such that the input to said amplifier is matched to said pad.

12. The system of claim 1, and further including a signature detection circuit for determining from the output of said processor the presence of footsteps, whereby the presence of an individual is determinable and whereby the speed of movement of said individual is determinable.

13. The system of claim 1, and further including a transmitter for transmitting the fact of the exceedance of said threshold to a remote location.

14. The system of claim 1, wherein said sensor and processor are battery powered and further including means for alerting individuals to the presence of an intruder adjacent said sensor, said alerting means being in deep sleep mode until such time as said threshold is exceeded, whereby the operational lifetime of said sensor is increased by limiting current drain during the sensing operation.

15. The system of claim 1, and further including a dart having fins, said sensor and said processor being carried by said dart, such that said dart can be launched to an area to be surveilled, whereby multiple sensors can be readily launched toward and positioned across a surveilled area.

16. A method for determining the presence of an individual in a surveilled area, comprising the steps of:
providing a passive E-field sensor having an ultra-high impedance antenna in the surveilled area for detecting a change in the E-field due to the presence of a moving individual in the vicinity of the E-field sensor; and,
providing a light-emitting device at the E-field sensor driven to emit light when the presence of an individual has been detected by the E-field sensor, whereby the location of the individual proximate to the sensor may be determined by detection of the position of the emitted light.

17. The method of claim 16, wherein said light-emitting device emits light in the non-visible region of the electromagnetic spectrum, thus to permit covert detection of the individual.

18. The method of claim 16, wherein said light-emitting device emits light in the visible region of the electromagnetic spectrum, thus to alert the individual that his presence has been detected.

19. The method of claim 16, wherein the light-emitting device is pulsed at a predetermined rate upon detection of the presence of an individual near the E-field sensor, thus to indicate the presence and position of the detected individual.

20. The method of claim 19, wherein the pulse rate at which the light-emitting device is driven is changed after detection of the presence of the individual, the changed pulsing drive persisting after the individual has been sensed and moves away from the sensor to indicate where the individual has passed.

* * * * *